(12) United States Patent
Mangal et al.

(10) Patent No.: US 11,694,015 B2
(45) Date of Patent: Jul. 4, 2023

(54) SIGNAL ROUTING BETWEEN MEMORY AND MEMORY CONTROLLER

(71) Applicant: NXP B.V., Eindhoven (NL)

(72) Inventors: Himanshu Mangal, Agra (IN); Pankaj Mudgil, Ohtak (IN); Siddhartha Jain, Noida (IN)

(73) Assignee: NXP B.V., Eindhoven (NL)

( * ) Notice: Subject to any disclaimer, the term of this patent is extended or adjusted under 35 U.S.C. 154(b) by 86 days.

(21) Appl. No.: 17/304,638

(22) Filed: Jun. 23, 2021

(65) Prior Publication Data

US 2022/0414308 A1 Dec. 29, 2022

(51) Int. Cl.
G06F 30/00 (2020.01)
G06F 30/394 (2020.01)
G06F 30/392 (2020.01)

(52) U.S. Cl.
CPC .......... G06F 30/394 (2020.01); G06F 30/392 (2020.01)

(58) Field of Classification Search
CPC .............................. G06F 30/394; G06F 30/392
See application file for complete search history.

(56) References Cited

U.S. PATENT DOCUMENTS

| | | | |
|---|---|---|---|
| 5,933,364 A * | 8/1999 | Aoyama | G11C 5/025 365/228 |
| 6,154,396 A * | 11/2000 | Yabe | G11C 11/4074 365/233.5 |
| 6,256,604 B1 * | 7/2001 | Yabe | G11C 7/1006 716/120 |
| 6,407,434 B1 * | 6/2002 | Rostoker | H01L 23/5222 257/E29.022 |
| 6,505,336 B1 | 1/2003 | Andreev et al. | |
| 6,519,746 B1 | 2/2003 | Andreev et al. | |
| 7,752,588 B2 * | 7/2010 | Bose | G06F 30/392 716/139 |
| 7,872,907 B2 * | 1/2011 | Okayama | G11C 11/1659 365/158 |
| 8,223,525 B2 * | 7/2012 | Balakrishnan | G11C 13/025 365/174 |
| 8,230,375 B2 * | 7/2012 | Madurawe | G06F 30/39 716/117 |

(Continued)

FOREIGN PATENT DOCUMENTS

| | | | | |
|---|---|---|---|---|
| CA | 2585870 C | * | 9/2014 | ......... G01R 31/3172 |
| CN | 104752415 B | * | 3/2018 | ......... G06F 17/5072 |

(Continued)

*Primary Examiner* — Naum Levin

(57) ABSTRACT

An integrated circuit (IC) layout includes various memory blocks arranged in rows and columns, and a memory controller arranged in parallel to one of the rows and the columns. The IC layout further includes metal routes that are created over the memory blocks for coupling the memory and the memory controller and facilitating signal routing therebetween. Each memory block is coupled with the memory controller by way of one or more metal routes. When the memory controller is arranged in parallel to the rows, the one or more metal routes are created over memory blocks that are included in a column, whereas when the memory controller is arranged in parallel to the columns, the one or more metal routes are created over memory blocks that are included in a row.

20 Claims, 5 Drawing Sheets

(56) References Cited

U.S. PATENT DOCUMENTS

| | | | |
|---|---|---|---|
| 8,582,340 B2* | 11/2013 | Chong | H01L 27/1052 |
| | | | 365/72 |
| 9,058,860 B2* | 6/2015 | Iyer | G11C 11/412 |
| 10,346,574 B2* | 7/2019 | Arimilli | H01L 27/11807 |
| 11,296,115 B1* | 4/2022 | Or-Bach | H01L 29/167 |
| 11,450,362 B2* | 9/2022 | Young | G11C 11/5628 |
| 11,488,939 B2* | 11/2022 | Or-Bach | H01L 25/0657 |
| 2002/0106878 A1* | 8/2002 | Chandna | G06F 30/394 |
| | | | 438/586 |
| 2004/0240259 A1* | 12/2004 | Kajigaya | G11C 29/70 |
| | | | 365/158 |
| 2009/0144688 A1 | 6/2009 | Uchino et al. | |
| 2020/0272781 A1* | 8/2020 | Chang | G06F 30/398 |
| 2020/0334406 A1 | 10/2020 | Patel et al. | |
| 2021/0320026 A1* | 10/2021 | Or-Bach | H01L 27/1108 |
| 2021/0383048 A1* | 12/2021 | Chang | G06F 30/398 |

FOREIGN PATENT DOCUMENTS

| | | | | |
|---|---|---|---|---|
| CN | 108804734 A | * | 11/2018 | G06F 17/5031 |
| EP | 3040888 A2 | | 7/2016 | |
| EP | 3040888 A3 | | 12/2016 | |
| JP | 2004158162 A | * | 6/2004 | G11C 11/16 |
| TW | 476069 B | * | 2/2002 | |
| TW | 202147167 A | * | 12/2021 | G03F 1/70 |

* cited by examiner

SIGNAL ROUTING BETWEEN MEMORY AND MEMORY CONTROLLER

BACKGROUND

The present disclosure relates generally to electronic design, and, more particularly, to signal routing between a memory and a memory controller on a layout of an integrated circuit (IC).

ICs include various memories and memory controllers that control operations associated with the memories. Each memory is divided into memory blocks that are arranged in various rows and columns on a layout of an IC (hereinafter referred to as an "IC layout"). Further, each memory block is coupled with an associated memory controller by way of various metal routes. The metal routes thus enable signal routing between the memory and the memory controller.

Typically, the metal routes coupling each memory block with the associated memory controller are formed in spaces between the adjacent memory blocks. A space between two adjacent memory blocks is referred to as a channel. A number of metal routes required for coupling each memory block to the memory controller is significant. Thus, an area occupied by each channel on the IC layout is significant. This significant channel area is also referred to as a memory overhead. The memory overhead results in a significant increase in a size of the memory, and in turn, in a size of the IC layout. The increased size of the IC layout leads to an increase in a manufacturing cost of the IC when such an IC is manufactured. Therefore, there exists a need for a technical solution that solves the aforementioned problems of existing IC layouts.

SUMMARY

In an embodiment of the present disclosure, an integrated circuit (IC) layout is disclosed. The IC layout can include a plurality of memory blocks, a memory controller, and a first plurality of metal routes. The plurality of memory blocks can be arranged in a set of rows and a set of columns. The memory controller can be arranged in parallel to one of the set of rows and the set of columns. Further, the first plurality of metal routes can be created over the plurality of memory blocks and enable the signal routing between the plurality of memory blocks and the memory controller. The first plurality of metal routes can be created such that each memory block of the plurality of memory blocks can be coupled with the memory controller by way of a first set of metal routes of the first plurality of metal routes.

In another embodiment of the present disclosure, an integrated circuit (IC) layout is disclosed. The IC layout can include a plurality of memory blocks, a memory controller, and a first plurality of metal routes. The plurality of memory blocks can be arranged in a set of rows and a set of columns. The memory controller can be arranged in parallel to one of the set of rows and the set of columns. Further, the first plurality of metal routes can be created over the plurality of memory blocks and enable the signal routing between the plurality of memory blocks and the memory controller. The first plurality of metal routes can be created such that each memory block of the plurality of memory blocks can be coupled with the memory controller by way of a first set of metal routes of the first plurality of metal routes. The first plurality of metal routes can be created by way of a set of metal layers associated with an IC. Each metal layer of the set of metal layers can correspond to one of a horizontal metal layer and a vertical metal layer. A number of metal layers included in the set of metal layers can be determined based on a number of available metal layers in the IC and a number of metal layers utilized within the plurality of memory blocks.

In yet another embodiment of the present disclosure, a method for facilitating signal routing on an IC layout using an electronic design automation (EDA) tool is disclosed. The method can include arranging a plurality of memory blocks of a memory in a set of rows and a set of columns. The method can further include arranging a memory controller in parallel to one of the set of rows and the set of columns. Further, the method can include creating a first plurality of metal routes over the plurality of memory blocks. The first plurality of metal routes can be created such that each memory block of the plurality of memory blocks can be coupled with the memory controller by way of a first set of metal routes of the first plurality of metal routes. The first plurality of metal routes enable the signal routing between the plurality of memory blocks and the memory controller.

In some embodiments, the IC layout can further include a set of buffers that can be arranged along each metal route of the first plurality of metal routes. A buffer of the set of buffers can be arranged in a channel between first and second memory blocks of the plurality of memory blocks. The first and second memory blocks can be adjacent to each other.

In some embodiments, when the memory controller is arranged in parallel to the set of rows, the first and second memory blocks can be included in a column of the set of columns. Further, when the memory controller is arranged in parallel to the set of columns, the first and second memory blocks can be included in a row of the set of rows.

In some embodiments, the plurality of memory blocks constitute a memory. The plurality of memory blocks can be arranged in the set of rows and the set of columns based on a set of memory parameters associated with the memory. The set of memory parameters can include a size of each memory block of the plurality of memory blocks, a number of memory blocks to be arranged in each row of the set of rows, and a number of memory blocks to be arranged in each column of the set of columns.

In some embodiments, the set of memory parameters can be determined based on control data. The control data can include a number of available metal layers in an IC and a number of metal layers utilized within the plurality of memory blocks. Further, the control data can include a delay value associated with each metal route of the first plurality of metal routes, a drive value of each buffer of the set of buffers, and an access time associated with each memory block of the plurality of memory blocks.

In some embodiments, the first plurality of metal routes can be created by way of a set of metal layers associated with the IC. A number of metal layers included in the set of metal layers can be determined based on the number of available metal layers in the IC and the number of metal layers utilized within the plurality of memory blocks.

In some embodiments, the first plurality of metal routes can be created based on a pitch of each metal layer of the set of metal layers and one of a width and a height of a memory block of the plurality of memory blocks.

In some embodiments, the first plurality of metal routes are created by way of a set of metal layers associated with an IC. The first set of metal routes is created over a set of memory blocks of the plurality of memory blocks. The set of memory blocks is included in one of a row of the set of rows and a column of the set of columns.

In some embodiments, each metal route of the first plurality of metal routes can be coupled with the memory controller and a pin of an associated memory block of the plurality of memory blocks. Further, for each metal route of the first plurality of metal routes, the pin of the associated memory block can be transposed by way of a net for coupling the corresponding metal route with the pin. The pin can be transposed when the pin is parallel to the set of rows and the set of memory blocks is included in the column of the set of columns.

In some embodiments, when the memory controller is arranged in parallel to the set of rows, the set of memory blocks is included in the column of the set of columns, and each metal layer of the set of metal layers corresponds to a vertical metal layer. When the memory controller is arranged in parallel to the set of columns, the set of memory blocks that is included in the row of the set of rows, and each metal layer of the set of metal layers corresponds to a horizontal metal layer.

In some embodiments, a second plurality of metal routes can be created in a plurality of channels associated with the plurality of memory blocks to further enable the signal routing between the plurality of memory blocks and the memory controller. Further, the second plurality of metal routes can be created such that each memory block of the plurality of memory blocks can be further coupled with the memory controller by way of a second set of metal routes of the second plurality of metal routes. The first and second pluralities of metal routes can be created by way of a set of metal layers associated with an IC.

Various embodiments of the present disclosure disclose an IC layout. The IC layout can include a memory that can be arranged in various rows and columns, and a memory controller that can be arranged in parallel to the rows or the columns. Further, the IC layout can include various metal routes that can be created over the memory to enable signal routing between the memory and the memory controller. The metal routes can be created such that each memory block can be coupled with the memory controller by way of one or more metal routes that are created over a set of memory blocks of the memory. When the memory controller is arranged in parallel to the rows, the set of memory blocks can be included in a column. Further, when the memory controller is arranged in parallel to the columns, the set of memory blocks can be included in a row.

As the metal routes are created over the memory for facilitating the signal routing between the memory and the memory controller, an area occupied by each channel on the IC layout of the present disclosure is significantly less than that on a conventional IC layout that creates all metal routes in various channels between memory blocks of a memory. Consequently, a size of the memory of the present disclosure is significantly less than that of a memory of the conventional IC layout, and in turn, a size of the overall IC layout of the present disclosure is significantly less than that of the conventional IC layout. The decreased size of the IC layout results in a low manufacturing cost of the IC of the present disclosure than that of an IC manufactured using the conventional IC layout.

BRIEF DESCRIPTION OF THE DRAWINGS

The following detailed description of the preferred embodiments of the present disclosure will be better understood when read in conjunction with the appended drawings. The present disclosure is illustrated by way of example, and not limited by the accompanying figures, in which like references indicate similar elements.

DETAILED DESCRIPTION

The detailed description of the appended drawings is intended as a description of the currently preferred embodiments of the present disclosure, and is not intended to represent the only form in which the present disclosure may be practiced. It is to be understood that the same or equivalent functions may be accomplished by different embodiments that are intended to be encompassed within the spirit and scope of the present disclosure.

Figure 1:
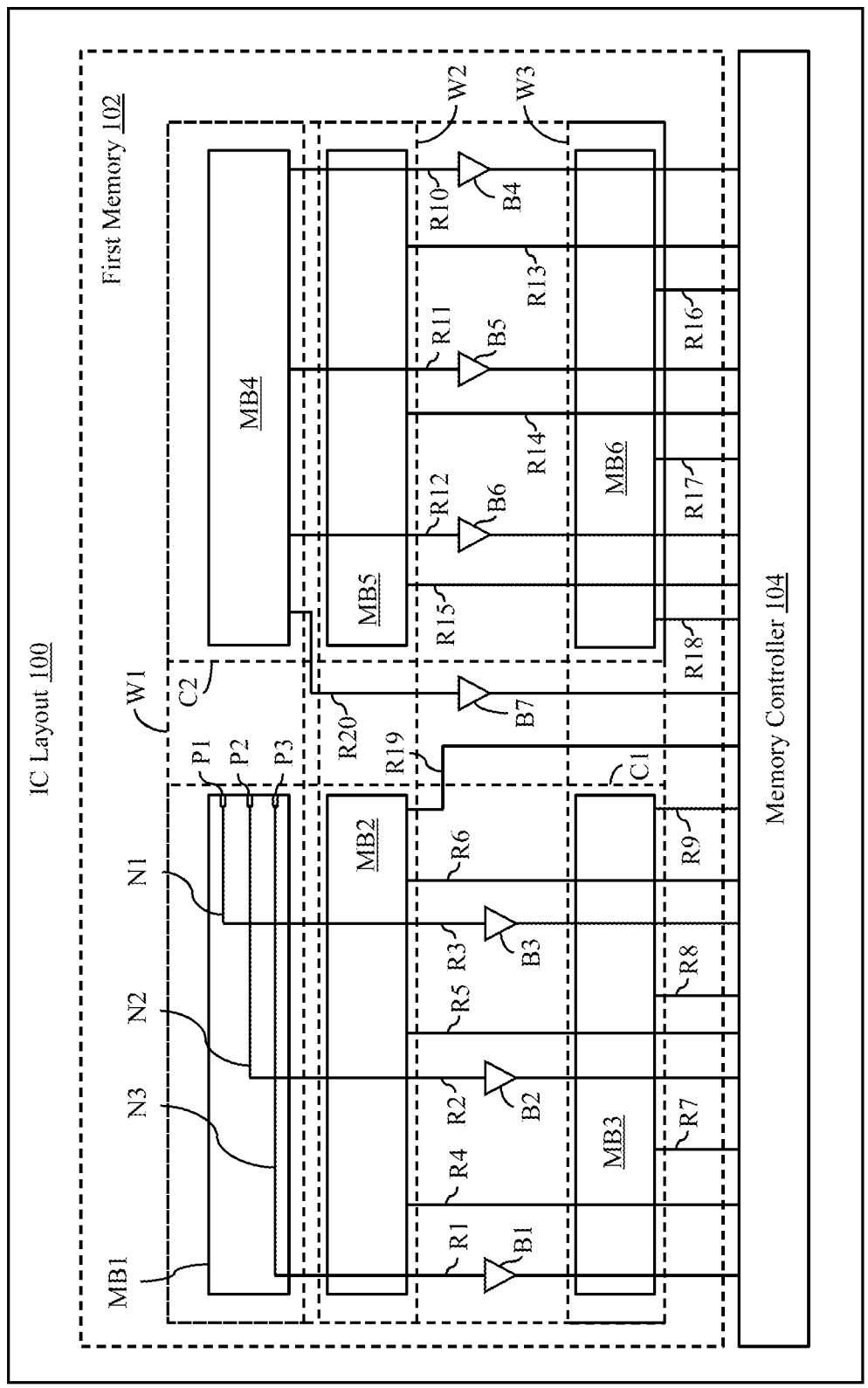
FIG. 1 illustrates a schematic diagram of an integrated circuit (IC) layout in accordance with an embodiment of the present disclosure.

FIG. 1 illustrates a schematic diagram of an integrated circuit (IC) layout 100 in accordance with an embodiment of the present disclosure. The IC layout 100 of an IC can include a first memory 102 and a memory controller 104. The first memory 102 can include a plurality of memory blocks of which first through sixth memory blocks MB1-MB6 are shown. The IC layout 100 can further include a first plurality of metal routes of which first through eighteenth metal routes R1-R18 are shown, and a first plurality of buffers of which first through sixth buffers B1-B6 are shown. The first plurality of metal routes are hereinafter referred to as the "first plurality of metal routes R1-R18", and the first plurality of buffers are hereinafter referred to as the "first plurality of buffers B1-B6". The first through eighteenth metal routes R1-R18 and the first through sixth buffers B1-B6 enable signal routing between the first memory 102 and the memory controller 104 on the IC layout 100.

The IC has various metal layers (not shown) associated therewith. Such metal layers can be a combination of horizontal and vertical metal layers. As a technology node of the IC lowers, a number of available metal layers in the IC significantly increases. Various metal layers of the available metal layers can be utilized within the first memory 102 for facilitating various data storage operations. The remaining metal layers can be utilized for facilitating the signal routing between the first memory 102 and the memory controller 104.

For the sake of ongoing discussion, it is assumed that the IC has first through tenth metal layers (not shown) associated therewith, of which the first through fourth metal layers are utilized within the first memory 102 (i.e., the first through sixth memory blocks MB1-MB6). Thus, the remaining six metal layers (i.e., the fifth through tenth metal layers) are available to be utilized for the signal routing. In such a scenario, the first through eighteenth metal routes R1-R18 can be created by way of one or more metal layers of the fifth through tenth metal layers. Further, from the remaining six metal layers, the fifth, seventh, and ninth metal layers can be vertical metal layers, and the sixth, eighth, and tenth metal layers can be horizontal metal layers.

In the IC layout 100 of FIG. 1, the first through eighteenth metal routes R1-R18 are created by way of the vertical metal layers (i.e., the fifth, seventh, and ninth metal layers). The fifth, seventh, and ninth metal layers can be collectively referred to as a "first set of metal layers". Thus, a number of metal layers included in the first set of metal layers can be determined based on the number of available metal layers in the IC and the number of metal layers utilized within the first memory 102 (i.e., the first through sixth memory blocks MB1-MB6).

The plurality of memory blocks of the first memory 102 can be arranged in various rows and columns on the IC layout 100. For example, the first through sixth memory blocks MB1-MB6 can be arranged in first through third rows W1-W3 and first and second columns C1 and C2. The first through third rows W1-W3 can be collectively referred to as a "set of rows W1-W3", and the first and second columns C1 and C2 can be collectively referred to as a "set of columns C1 and C2". In such a scenario, the first row W1 can include the first and fourth memory blocks MB1 and MB4, and the second row W2 can include the second and fifth memory blocks MB2 and MB5. Similarly, the third row W3 can include the third and sixth memory blocks MB3 and MB6. Further, the first column C1 can include the first through third memory blocks MB1-MB3, and the second column C2 can include the fourth through sixth memory blocks MB4-MB6. Hence, the second memory block MB2 can be vertically adjacent to the first memory block MB1. Similarly, the fourth memory block MB4 can be horizontally adjacent to the first memory block MB1. Further, as illustrated in FIG. 1, the memory controller 104 can be arranged in parallel to the set of rows W1-W3. For example, the memory controller 104 can be arranged below the third row W3.

The first through sixth memory blocks MB1-MB6 can be further arranged such that a channel (i.e., a gap) is formed between two adjacent memory blocks. A channel formed between adjacent memory blocks of the first column C1 (e.g., a channel formed between the first and second memory blocks MB1 and MB2) corresponds to a horizontal channel. Similarly, a channel formed between adjacent memory blocks of the first row W1 (e.g., a channel formed between the first and fourth memory blocks MB1 and MB4) corresponds to a vertical channel.

It will be apparent to a person skilled in the art that the first memory 102 is shown to include six memory blocks (i.e., the first through sixth memory blocks MB1-MB6) to make the illustrations concise and clear and should not be considered as a limitation of the present disclosure. In various other embodiments, the first memory 102 can include more than six memory blocks, without deviating from the scope of the present disclosure. Such memory blocks can be arranged in various rows and columns with a number of rows and a number of columns being greater than three and two, respectively. Further, each row can include more than two memory blocks, and each column can include more than three memory blocks.

The first through sixth memory blocks MB1-MB6 can be arranged in the set of rows W1-W3 and the set of columns C1 and C2 based on a set of memory parameters (not shown) associated with the first memory 102. The set of memory parameters can include a size (e.g., 64 kilobytes, 128 kilobytes, or the like) of each memory block of the first through sixth memory blocks MB1-MB6, a number of memory blocks to be arranged in each row of the set of rows W1-W3, and a number of memory blocks to be arranged in each column of the set of columns C1 and C2.

The set of memory parameters can be determined based on control data (shown later in FIG. 3). The control data can include the number of available metal layers in the IC and the number of metal layers utilized within the first memory 102 (i.e., the first through sixth memory blocks MB1-MB6). The control data can further include a delay value associated with each metal route of the first through eighteenth metal routes R1-R18 and a drive value of each buffer of the first through sixth buffers B1-B6. Further, the control data can include an access time associated with each memory block of the first through sixth memory blocks MB1-MB6.

The first plurality of metal routes R1-R18 (i.e., the first through eighteenth metal routes R1-R18) can be created over various memory blocks (e.g., the first through sixth memory blocks MB1-MB6) of the first memory 102 to enable the signal routing between the first memory 102 and the memory controller 104. The first plurality of metal routes R1-R18 are created such that the first memory block MB1 is coupled with the memory controller 104 by way of the first through third metal routes R1-R3. The first through third metal routes R1-R3 can be collectively referred to as a "first set of metal routes R1-R3". In such a scenario, the first through third metal routes R1-R3 can be created over the second and third memory blocks MB2 and MB3. Similarly, the second memory block MB2 can be coupled with the memory controller 104 by way of the fourth through sixth metal routes R4-R6 that can be created over the third memory block MB3. The fourth through sixth metal routes R4-R6 can be collectively referred to as a "second set of metal routes R4-R6". Further, the third memory block MB3 can be coupled with the memory controller 104 by way of the seventh through ninth metal routes R7-R9. The seventh through ninth metal routes R7-R9 can be collectively referred to as a "third set of metal routes R7-R9". As the memory controller 104 is arranged in parallel to the set of rows W1-W3, the first through ninth metal routes R1-R9 can be created by way of the vertical metal layers. For the sake of ongoing discussion, it is assumed that the first through third metal routes R1-R3 are created by way of the fifth metal layer, and the fourth through sixth metal routes R4-R6 are created by way of the seventh metal layer. Further, the seventh through ninth metal routes R7-R9 are created by way of the ninth metal layer.

The fourth memory block MB4 can similarly be coupled with the memory controller 104 by way of the tenth through twelfth metal routes R10-R12 that are created over the fifth and sixth memory blocks MB5 and MB6. The tenth through twelfth metal routes R10-R12 can be collectively referred to as a "fourth set of metal routes R10-R12". Similarly, the fifth memory block MB5 can be coupled with the memory controller 104 by way of the thirteenth through fifteenth metal routes R13-R15 that can be created over the sixth memory block MB6. The thirteenth through fifteenth metal routes R13-R15 can be collectively referred to as a "fifth set of metal routes R13-R15". Further, the sixth memory block MB6 can be coupled with the memory controller 104 by way of the sixteenth through eighteenth metal routes R16-R18. The sixteenth through eighteenth metal routes R16-R18 can be collectively referred to as a "sixth set of metal routes R16-R18". As the memory controller 104 is arranged in parallel to the set of rows W1-W3, the tenth through eighteenth metal routes R10-R18 can be created by way of the vertical metal layers. For the sake of ongoing discussion, it is assumed that the tenth through twelfth metal routes R10-R12 are created by way of the fifth metal layer, the thirteenth through fifteenth metal routes R13-R15 are created by way of the seventh metal layer, and the sixteenth through eighteenth metal routes R16-R18 are created by way of the ninth metal layer.

When the memory controller 104 is arranged in parallel to the set of rows W1-W3, all the metal routes coupling the first and second memory blocks MB1 and MB2 with the memory controller 104 are created over the third memory block MB3. Additionally, the seventh through ninth metal routes R7-R9 couple the third memory block MB3 to the memory controller 104. In such a scenario, a number of metal routes that can be created over the third memory block MB3 can be determined based on a width of the third memory block MB3 and pitches of various metal layers utilized for creating the first through ninth metal routes R1-R9 (i.e., the fifth, seventh, and ninth metal layers). For example, if a width of the third memory block MB3 is 18 micron and a pitch of the ninth metal layer is 0.5 micron, a number of metal routes that can be created over the third memory block MB3 is equal to 9 (i.e., 0.5*18).

All the metal routes coupling the fourth and fifth memory blocks MB4 and MB5 with the memory controller 104 can similarly be created over the sixth memory block MB6. Additionally, the sixteenth through eighteenth metal routes R16-R18 couple the sixth memory block MB6 to the memory controller 104. In such a scenario, a number of metal routes that can be created over the sixth memory block MB6 can be determined based on a width of the sixth memory block MB6 and the pitches of various metal layers utilized for creating the tenth through eighteenth metal routes R10-R18 (i.e., the fifth, seventh, and ninth metal layers).

For the sake of ongoing discussion, it is assumed that six metal routes can be created over each of the third and sixth memory blocks MB3 and MB6, in addition to the three metal routes coupling each of the third and sixth memory blocks MB3 and MB6 to the memory controller 104, without violating design rules and timing constraints associated with the IC layout 100. Thus, the first through sixth metal routes R1-R6 can be created over the third memory block MB3 and the tenth through fifteenth metal routes R10-R15 can be created over the sixth memory block MB6, without violating the design rules and the timing constraints associated with the IC layout 100. The first through eighteenth metal routes R1-R18 created over various memory blocks of the plurality of memory blocks can thus enable the signal routing between the first through sixth memory blocks MB1-MB6 and the memory controller 104.

If, however, any of the first and second memory blocks MB1 and MB2 requires an additional metal route for the signal routing with the memory controller 104, the additional metal route cannot be created over the third memory block MB3 to avoid violation of design rules and timing constraints associated with the IC layout 100. For example, if a nineteenth metal route R19 is required for further facilitating the signal routing between the second memory block MB2 and the memory controller 104, the nineteenth metal route R19 cannot be created over the third memory block MB3. In such a scenario, the nineteenth metal route R19 can be created in a vertical channel between the third and sixth memory blocks MB3 and MB6. The second memory block MB2 can be thus further coupled with the memory controller 104 by way of the nineteenth metal route R19. Similarly, if a twentieth metal route R20 is required for further facilitating the signal routing between the fourth memory block MB4 and the memory controller 104, the twentieth metal route R20 cannot be created over the sixth memory block MB6. In such a scenario, the twentieth metal route R20 can be created in a vertical channel between the second and fifth memory blocks MB2 and MB5, and a vertical channel between the third and sixth memory blocks MB3 and MB6. In such a scenario, a seventh buffer B7 can be arranged along the twentieth metal route R20 to boost various signals propagating on the twentieth metal route R20. The fourth memory block MB4 can be thus further coupled with the memory controller 104 by way of the twentieth metal route R20. For the sake of ongoing discussion, it is assumed that the nineteenth and twentieth metal routes R19 and R20 can be created by way of the seventh and fifth metal layers, respectively. The nineteenth and twentieth metal routes R19 and R20 can be collectively referred to as a "second plurality of metal routes R19 and R20".

It will be apparent to a person skilled in the art that the first through sixth memory blocks MB1-MB6 are shown to be coupled with the memory controller 104 by way of three or four metal routes to make the illustrations concise and clear and should not be considered as a limitation of the present disclosure. In various other embodiments, each memory block of the first through sixth memory blocks MB1-MB6 can be coupled with the memory controller 104 by way of more than four metal routes, without deviating from the scope of the present disclosure.

The first through third buffers B1-B3 can be arranged along the first through third metal routes R1-R3 to boost various signals propagating on the first through third metal routes R1-R3, respectively. The first through third buffers B1-B3 can be arranged at first through third distances (not shown) from the first memory block MB1 based on delay values associated with the first through third metal routes R1-R3 and drive values of the first through third buffers B1-B3, respectively. As illustrated in FIG. 1, the first through third buffers B1-B3 can be arranged in a horizontal channel formed between the second and third memory blocks MB2 and MB3. Thus, the first through third buffers B1-B3 compensate for attenuation experienced by signals propagating on the first through third metal routes R1-R3, respectively.

The fourth through sixth buffers B4-B6 can similarly be arranged along the tenth through twelfth metal routes R10-R12 to boost various signals propagating on the tenth through twelfth metal routes R10-R12, respectively. The fourth through sixth buffers B4-B6 can be arranged at fourth through sixth distances (not shown) from the fourth memory block MB4 based on delay values associated with the tenth through twelfth metal routes R10-R12 and drive values of the fourth through sixth buffers B4-B6, respectively.

It will be apparent to a person skilled in the art that one buffer is shown to be arranged along each of the first through third metal routes R1-R3 and the tenth through twelfth metal routes R10-R12 to make the illustrations concise and clear and should not be considered as a limitation of the present disclosure. In various other embodiments, more than one buffer can be arranged along each metal route of the first through third metal routes R1-R3 and the tenth through twelfth metal routes R10-R12, without deviating from the scope of the present disclosure. Each buffer can be arranged in a channel formed between two vertically adjacent memory blocks or in a channel formed between a memory block and the memory controller 104. Further, one or more buffers can be arranged along each remaining metal route of the first plurality of metal routes R1-R18 in a similar manner as described above, without deviating from the scope of the present disclosure.

The first memory block MB1 can include a first plurality of pins of which first through third pins P1-P3 are shown. The first through third metal routes R1-R3 can be coupled with the memory controller 104 and the third through first pins P3-P1 for facilitating the signal routing between the first memory block MB1 and the memory controller 104, respectively. The first through third pins P1-P3 are parallel to the set of rows W1-W3. Further, the first through third metal routes R1-R3 are created over the second and third memory blocks MB2 and MB3 that are included in the first column C1. In such a scenario, to couple the first through third pins P1-P3 and the third through first metal routes R3-R1, the first through third pins P1-P3 are transposed by way of first through third nets N1-N3, respectively. In other words, the third through first metal routes R3-R1 can be coupled with the first through third pins P1-P3 by way of the first through third nets N1-N3, respectively. Further, the first through third pins P1-P3 can be transposed in a crossover manner to adhere to the design rules associated with the IC layout 100. It will be apparent to a person skilled in the art that the second through sixth memory blocks MB2-MB6 can include second through sixth pluralities of pins (not shown). Further, each pin of the second through sixth pluralities of pins can be transposed by way of an associated net (not shown) for coupling with an associated metal route.

Figure 2:
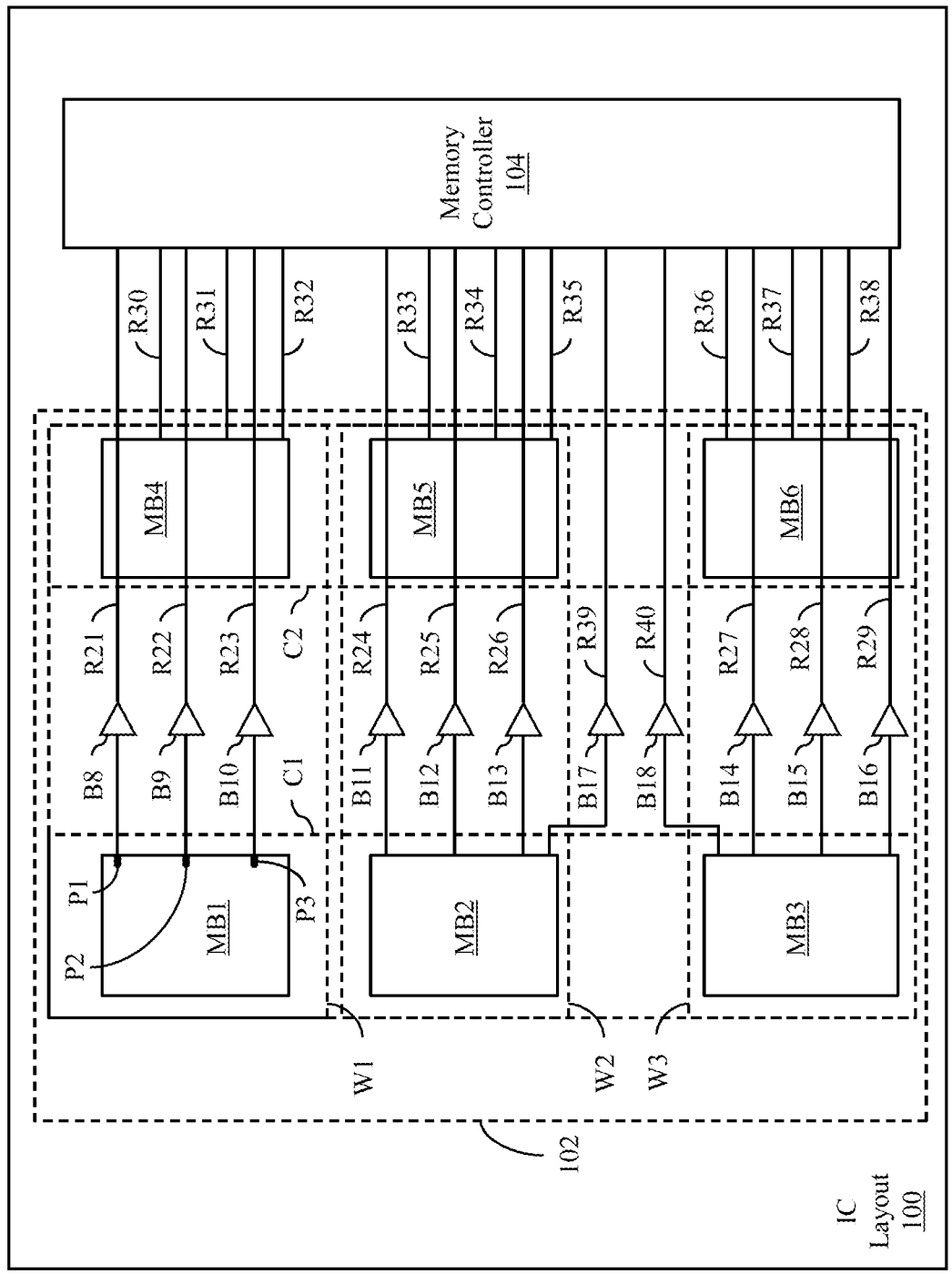
FIG. 2 illustrates a schematic diagram of the IC layout in accordance with another embodiment of the present disclosure.

FIG. 2 illustrates a schematic diagram of the IC layout 100 in accordance with another embodiment of the present disclosure. The IC layout 100 can include the first memory 102 and the memory controller 104. The IC layout 100 can further include a third plurality of metal routes of which twenty-first through thirty-eighth metal routes R21-R38 are shown, and a second plurality of buffers of which eighth through sixteenth buffers B8-B16 are shown. The third plurality of metal routes are hereinafter referred to as the "third plurality of metal routes R21-R38", and the second plurality of buffers are hereinafter referred to as the "second plurality of buffers B8-B16".

The IC has various metal layers (i.e., the first through tenth metal layers) associated therewith, of which the first through fourth metal layers are utilized within the first memory 102, and the remaining six metal layers (i.e., the fifth through tenth metal layers) are available to be utilized for the signal routing. In the IC layout 100 of FIG. 2, the twenty-first through thirty-eighth metal routes R21-R38 can be created by way of the horizontal metal layers (i.e., the sixth, eighth, and tenth metal layers). The sixth, eighth, and tenth metal layers can be collectively referred to as a "second set of metal layers". Thus, a number of metal layers included in the second set of metal layers can be determined based on the number of available metal layers in the IC and the number of metal layers utilized within the first memory 102.

The first memory 102 can include the first through sixth memory blocks MB1-MB6 that can be arranged in the first through third rows W1-W3 and the first and second columns C1 and C2. The arrangement of the first through sixth memory blocks MB1-MB6 on the IC layout 100 of FIG. 2 is same as that on the IC layout 100 of FIG. 1. The difference between the IC layout 100 of FIG. 2 and the IC layout 100 of FIG. 1 is in the arrangement of the memory controller 104. In the IC layout 100 of FIG. 2, the memory controller 104 can be arranged in parallel to the set of columns C1 and C2.

The third plurality of metal routes R21-R38 (i.e., the twenty-first through thirty-eighth metal routes R21-R38) can be created over various memory blocks (i.e., the first through sixth memory blocks MB1-MB6) of the first memory 102 to enable the signal routing between the first memory 102 and the memory controller 104. The third plurality of metal routes R21-R38 can be created such that the first memory block MB1 is coupled with the memory controller 104 by way of the twenty-first through twenty-third metal routes R21-R23. The twenty-first through twenty-third metal routes R21-R23 can be collectively referred to as a "seventh set of metal routes R21-R23". In such a scenario, the twenty-first through twenty-third metal routes R21-R23 can be created over the fourth memory block MB4.

The second memory block MB2 can be similarly coupled with the memory controller 104 by way of the twenty-fourth through twenty-sixth metal routes R24-R26 that can be created over the fifth memory block MB5. The twenty-fourth through twenty-sixth metal routes R24-R26 can be collectively referred to as an "eighth set of metal routes R24-R26". Further, the third memory block MB3 can be coupled with the memory controller 104 by way of the twenty-seventh through twenty-ninth metal routes R27-R29 that can be created over the sixth memory block MB6. The twenty-seventh through twenty-ninth metal routes R27-R29 can be collectively referred to as a "ninth set of metal routes R27-R29".

As the memory controller 104 is arranged in parallel to the set of columns C1 and C2, the twenty-first through twenty-ninth metal routes R21-R29 are created by way of the horizontal metal layers. For the sake of ongoing discussion, it is assumed that the twenty-first through twenty-third metal routes R21-R23 are created by way of the sixth metal layer, and the twenty-fourth through twenty-sixth metal routes R24-R26 are created by way of the eighth metal layer. Further, the twenty-seventh through twenty-ninth metal routes R27-R29 are created by way of the tenth metal layer.

The fourth memory block MB4 can similarly be coupled with the memory controller 104 by way of the thirtieth through thirty-second metal routes R30-R32, and the fifth memory block MB5 can be coupled with the memory controller 104 by way of the thirty-third through thirty-fifth metal routes R33-R35. The thirtieth through thirty-second metal routes R30-R32 can be collectively referred to as a "tenth set of metal routes R30-R32", and the thirty-third through thirty-fifth metal routes R33-R35 can be collectively referred to as an "eleventh set of metal routes R33-R35". Further, the sixth memory block MB6 can be coupled with the memory controller 104 by way of the thirty-sixth through thirty-eighth metal routes R36-R38. The thirty-sixth through thirty-eighth metal routes R36-R38 can be collectively referred to as a "twelfth set of metal routes R36-R8".

As the memory controller 104 is arranged in parallel to the set of columns C1 and C2, the thirtieth through thirty-eighth metal routes R30-R38 can be created by way of the horizontal metal layers. For the sake of ongoing discussion, it is assumed that the thirtieth through thirty-second metal routes R30-R32 are created by way of the sixth metal layer, the thirty-third through thirty-fifth metal routes R33-R35 are created by way of the eighth metal layer, and the thirty-sixth through thirty-eighth metal routes R36-R38 are created by way of the tenth metal layer.

When the memory controller 104 is arranged in parallel to the set of columns C1 and C2, all the metal routes coupling the first through third memory blocks MB1-MB3 with the memory controller 104 are created over the fourth through sixth memory blocks MB4-MB6, respectively. Additionally, each of the fourth through sixth memory blocks MB4-MB6 has an associated set of metal routes (e.g., the tenth through twelfth sets of metal routes R30-R32, R33-R35, and R36-R38) that couple the corresponding memory block to the memory controller 104. In such a scenario, a number of metal routes that can be created over each of the fourth through sixth memory blocks MB4-MB6 can be determined based on a height of the corresponding memory block and pitches of various metal layers utilized for creating the third plurality of metal routes R21-R38 (i.e., the sixth, eighth, and tenth metal layers). For example, if a height of the sixth memory block MB6 is 12 micron and a pitch of the tenth metal layer is 0.5 micron, a number of metal routes that can be created over the sixth memory block MB6 is equal to 6 (i.e., **0.5*12**).

For the sake of ongoing discussion, it is assumed that three metal routes can be created over each of the fourth through sixth memory blocks MB4-MB6, without violating the design rules and the timing constraints associated with the IC layout 100. This is in addition to the three metal routes coupling each of the fourth through sixth memory blocks MB4-MB6 to the memory controller 104. Thus, the twenty-first through twenty-third metal routes R21-R23 can be created over the fourth memory block MB4 and the twenty-fourth through twenty-sixth metal routes R24-R26 can be created over the fifth memory block MB5, without violating the design rules and the timing constraints associated with the IC layout 100. Similarly, the twenty-seventh through twenty-ninth metal routes R27-R29 can be created over the sixth memory block MB6, without violating the design rules and the timing constraints associated with the IC layout 100. The twenty-first through thirty-eighth metal routes R21-R38 created over various memory blocks of the plurality of memory blocks can thus enable the signal routing between the first through sixth memory blocks MB1-MB6 and the memory controller 104.

If, however, any of the first through third memory blocks MB1-MB3 requires an additional metal route for the signal routing with the memory controller 104, the additional metal route cannot be created over the fourth through sixth memory blocks MB4-MB6, respectively. For example, if a thirty-ninth metal route R39 is required for further facilitating the signal routing between the second memory block MB2 and the memory controller 104, the thirty-ninth metal route R39 cannot be created over the fifth memory block MB5. In such a scenario, the thirty-ninth metal route R39 can be created in a horizontal channel between the fifth and sixth memory blocks MB5 and MB6. Further, a seventeenth buffer B17 can be arranged along the thirty-ninth metal route R39 to boost various signals propagating on the thirty-ninth metal route R39. The second memory block MB2 can be thus further coupled with the memory controller 104 by way of the thirty-ninth metal route R39.

If a fortieth metal route R40 is required for further facilitating the signal routing between the third memory block MB3 and the memory controller 104, the fortieth metal route R40 cannot be created over the sixth memory block MB6. In such a scenario, the fortieth metal route R40 can be created in the horizontal channel between the fifth and sixth memory blocks MB5 and MB6. Further, an eighteenth buffer B18 can be arranged along the fortieth metal route R40 to boost various signals propagating on the fortieth metal route R40. The third memory block MB3 can be thus further coupled with the memory controller 104 by way of the fortieth metal route R40. For the sake of ongoing discussion, it is assumed that the thirty-ninth and fortieth metal routes R39 and R40 can be collectively referred to as a "fourth plurality of metal routes R39 and R40", and can be created by way of the eighth and tenth metal layers, respectively.

The eighth through tenth buffers B8-B10 can be arranged along the twenty-first through twenty-third metal routes R21-R23 to boost various signals propagating on the twenty-first through twenty-third metal routes R21-R23, respectively. The eighth through tenth buffers B8-B10 are arranged at seventh through ninth distances (not shown) from the first memory block MB1 based on delay values associated with the twenty-first through twenty-third metal routes R21-R23 and drive values of the eighth through tenth buffers B8-B10, respectively. As illustrated in FIG. 2, the eighth through tenth buffers B8-B10 can be arranged in a vertical channel formed between the first and fourth memory blocks MB1 and MB4. Thus, the eighth through tenth buffers B8-B10 compensate for attenuation experienced by signals propagating on the twenty-first through twenty-third metal routes R21-R23, respectively.

The eleventh through thirteenth buffers B11-B13 can similarly be arranged along the twenty-fourth through twenty-sixth metal routes R24-R26 to boost various signals propagating on the twenty-fourth through twenty-sixth metal routes R24-R26, respectively. The eleventh through thirteenth buffers B11-B13 can be arranged along the twenty-fourth through twenty-sixth metal routes R24-R26 at tenth through twelfth distances (not shown) from the second memory block MB2, respectively. Further, the eleventh through thirteenth buffers B11-B13 can be arranged based on delay values associated with the twenty-fourth through twenty-sixth metal routes R24-R26 and drive values of the eleventh through thirteenth buffers B11-B13, respectively. Similarly, the fourteenth through sixteenth buffers B14-B16 can be arranged along the twenty-seventh through twenty-ninth metal routes R27-R29 to boost various signals propagating on the twenty-seventh through twenty-ninth metal routes R27-R29, respectively. The fourteenth through sixteenth buffers B14-B16 can be arranged along the twenty-seventh through twenty-ninth metal routes R27-R29 at thirteenth through fifteenth distances (not shown) from the third memory block MB3, respectively. Further, the fourteenth through sixteenth buffers B14-B16 can be arranged based on delay values associated with the twenty-seventh through twenty-ninth metal routes R27-R29 and drive values of the fourteenth through sixteenth buffers B14-B16, respectively.

It will be apparent to a person skilled in the art that one buffer is shown to be arranged along each of the twenty-first through twenty-ninth metal routes R21-R29 to make the illustrations concise and clear and should not be considered as a limitation of the present disclosure. In various other embodiments, more than one buffer can be arranged along each of the twenty-first through twenty-ninth metal routes R21-R29, without deviating from the scope of the present disclosure. Each buffer can be arranged in a channel formed between two horizontally adjacent memory blocks or in a channel formed between a memory block and the memory controller 104. Further, one or more buffers can be arranged along each remaining metal route of the third plurality of metal routes R21-R38 in a similar manner as described above, without deviating from the scope of the present disclosure.

The first memory block MB1 can include the first through third pins P1-P3. The twenty-first through twenty-third metal routes R21-R23 can be coupled with the memory controller 104 and the first through third pins P1-P3 for facilitating the signal routing between the first memory block MB1 and the memory controller 104, respectively. The first through third pins P1-P3 are parallel to the set of rows W1-W3. Further, as the third plurality of metal routes R21-R38 are created over the set of rows W1-W3, the first through third pins P1-P3 can be coupled with the twenty-first through twenty-third metal routes R21-R23 sans pin transposition.

Although FIGS. 1 and 2 illustrate two embodiments of the IC layout 100, it will be apparent to a person skilled in the art that the scope of the present disclosure is not limited to it. In various other embodiments, a layout of the IC can be a combination of both the IC layouts 100 of FIGS. 1 and 2, without deviating from the scope of the present disclosure. In such a scenario, for one set of memory blocks of the plurality of memory blocks, one memory controller can be arranged in parallel to a row (as illustrated in FIG. 1), and for another set of memory blocks of the plurality of memory blocks, another memory controller can be arranged in parallel to a column (as illustrated in FIG. 2).

Figure 3:
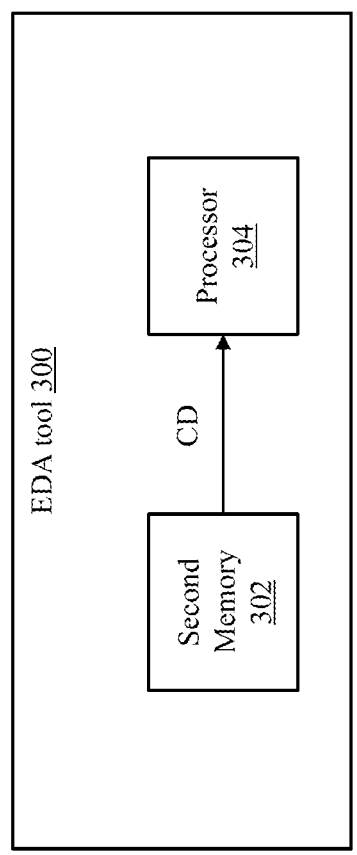
FIG. 3 illustrates a schematic block diagram of an electronic design automation (EDA) tool in accordance with an embodiment of the present disclosure.

FIG. 3 illustrates a schematic block diagram of an electronic design automation (EDA) tool 300 in accordance with an embodiment of the present disclosure. The EDA tool 300 can be configured to enable the signal routing on the IC layout 100. The EDA tool 300 can include a second memory 302 and a processor 304 that can be coupled with the second memory 302. The processor 304 and the second memory 302 form a computer system that may represent a stand-alone personal computer, a network of processors and memories, a mainframe system, or the like.

The second memory 302 can include suitable circuitry that can be configured to perform one or more operations. For example, the second memory 302 can be configured to store the control data (hereinafter referred to and designated as the "control data CD"). Examples of the second memory 302 can include a static random-access memory, a dynamic random-access memory, a flash memory, or the like.

The processor 304 can include suitable circuitry that can be configured to perform one or more operations. For example, the processor 304 can be configured to retrieve the control data CD from the second memory 302. Based on the control data CD, the processor 304 can be configured to determine the set of memory parameters associated with the first memory 102. The processor 304 can be further configured to arrange the plurality of memory blocks (i.e., the first through sixth memory blocks MB1-MB6) in the set of rows W1-W3 and the set of columns C1 and C2 based on the set of memory parameters. Further, the processor 304 can be configured to arrange the memory controller 104 in parallel to the first memory 102. The memory controller 104 can be arranged in parallel to one of the set of rows W1-W3 and the set of columns C1 and C2. Examples of the processor 304 can include, but are not limited to, an application-specific integrated circuit processor, a reduced instruction set computing processor, a complex instruction set computing processor, a field-programmable gate array, or the like.

When the memory controller 104 is arranged in parallel to the set of rows W1-W3, the processor 304 can be further configured to create the first plurality of metal routes R1-R18 over the first memory 102 to enable the signal routing between the first memory 102 and the memory controller 104. The first plurality of metal routes R1-R18 can be created such that each memory block of the plurality of memory blocks (i.e., the first through sixth memory blocks MB1-MB6) can be coupled with the memory controller 104 by way of one set of metal routes (such as the first through sixth sets of metal routes R1-R3, R4-R6, R7-R9, R10-R12, R13-R15, and R16-R18). Each set of metal routes is created over a first set of memory blocks of the plurality of memory blocks. For example, the first set of metal routes R1-R3 is created over the second and third memory blocks MB2 and MB3. As the memory controller 104 is arranged in parallel to the set of rows W1-W3, the first set of memory blocks is included in a column of the set of columns C1 and C2. Further, the first plurality of metal routes R1-R18 are created by way of the first set of metal layers (i.e., the fifth, seventh, and ninth metal layers). Each metal route of the first plurality of metal routes R1-R18 is created based on the pitch of the corresponding metal layer and the width of a memory block (i.e., one of the third memory block MB3 and the sixth memory block MB6 as shown in FIG. 1) of the plurality of memory blocks.

The processor 304 can be further configured to create the second plurality of metal routes R19 and R20 to further enable the signal routing between the plurality of memory blocks and the memory controller 104. The processor 304 can create the second plurality of metal routes R19 and R20 such that the second and fourth memory blocks MB2 and MB4 are further coupled with the memory controller 104 by way of the nineteenth and twentieth metal routes R19 and R20, respectively. The processor 304 creates the second plurality of metal routes R19 and R20 by way of the first set of metal layers.

The processor 304 can be further configured to arrange a first set of buffers along each metal route of the first plurality of metal routes R1-R18 and the second plurality of metal routes R19 and R20. For example, the processor 304 can be further configured to arrange the first through seventh buffers B1-B7 along the first through third metal routes R1-R3, the tenth through twelfth metal routes R10-R12, and the twentieth metal route R20, respectively. Each buffer of the first set of buffers is arranged in a channel between two adjacent memory blocks of the plurality of memory blocks. As the memory controller 104 is arranged in parallel to the set of rows W1-W3, each buffer can be arranged in a channel between two vertically adjacent blocks (i.e., two memory blocks that are included in a column of the set of columns C1 and C2).

The processor 304 can be further configured to couple each metal route of the first plurality of metal routes R1-R18 and the second plurality of metal routes R19 and R20 with the memory controller 104 and a pin of an associated memory block of the plurality of memory blocks. For example, the processor 304 can be further configured to couple the first through third metal routes R1-R3 with the third through first pins P3-P1, respectively. The first memory 102 can be thus coupled with the memory controller 104. Further, the processor 304 can be configured to transpose, for each metal route of the first plurality of metal routes R1-R18 and the second plurality of metal routes R19 and R20, the pin of the associated memory block by way of a net for coupling the corresponding metal route with the pin. For example, the processor 304 can be further configured to transpose the first through third pins P1-P3 by way of the first through third nets N1-N3 for coupling the third through first metal routes R3-R1 with the first through third pins P1-P3, respectively. The processor 304 transposes the pin when the memory controller 104 is arranged in parallel to the set of rows W1-W3 and the first set of memory blocks is included in a column of the set of columns C1 and C2.

When the memory controller 104 is arranged in parallel to the set of columns C1 and C2, the processor 304 can be further configured to create the third plurality of metal routes R21-R38 over the first memory 102 to enable the signal routing between the first memory 102 and the memory controller 104. The third plurality of metal routes R21-R38 can be created such that each memory block of the plurality of memory blocks (i.e., the first through sixth memory blocks MB1-MB6) can be coupled with the memory controller 104 by way of one set of metal routes (such as the seventh through twelfth sets of metal routes R21-R23, R24-R26, R27-R29, R30-R32, R33-R35, and R36-R38). Each set of metal routes is created over a second set of memory blocks of the plurality of memory blocks. For example, the seventh set of metal routes R21-R23 are created over the fourth memory block MB4. As the memory controller 104 is arranged in parallel to the set of columns C1 and C2, the second set of memory blocks is included in a row of the set of rows W1-W3. Further, the third plurality of metal routes R21-R38 are created by way of the second set of metal layers (i.e., the sixth, eighth, and tenth metal layers). Each metal route of the third plurality of metal routes R21-R38 is created based on the pitch of the corresponding metal layer and the height of a memory block (i.e., one of the fourth through sixth memory blocks MB4-MB6) of the plurality of memory blocks.

The processor 304 can be further configured to create the fourth plurality of metal routes R39 and R40 to further enable the signal routing between the plurality of memory blocks and the memory controller 104. The processor 304 can create the fourth plurality of metal routes R39 and R40 such that the second and third memory blocks MB2 and MB3 are further coupled with the memory controller 104 by way of the thirty-ninth and fortieth metal routes R39 and R40, respectively. The fourth plurality of metal routes R39 and R40 are created by way of the second set of metal layers.

The processor 304 can be further configured to arrange a second set of buffers along each metal route of the third plurality of metal routes R21-R38 and the fourth plurality of metal routes R39 and R40. For example, the processor 304 can be further configured to arrange the eighth through eighteenth buffers B8-B18 along the twenty-first through twenty-ninth metal routes R21-R29 and the thirty-ninth and fortieth metal routes R39 and R40, respectively. Each buffer of the second set of buffers is arranged in a channel between two adjacent memory blocks of the plurality of memory blocks. As the memory controller 104 is arranged in parallel to the set of columns C1 and C2, each buffer can be arranged in a channel between two horizontally adjacent blocks (i.e., two memory blocks that are included in a row of the set of rows W1-W3).

The processor 304 can be further configured to couple each metal route of the third plurality of metal routes R21-R38 and the fourth plurality of metal routes R39 and R40 with the memory controller 104 and the pin of the associated memory block of the plurality of memory blocks. For example, the processor 304 can be further configured to couple the twenty-first through twenty-third metal routes R21-R23 with the first through third pins P1-P3, respectively. The first memory 102 can be thus coupled with the memory controller 104.

Figure 4A:
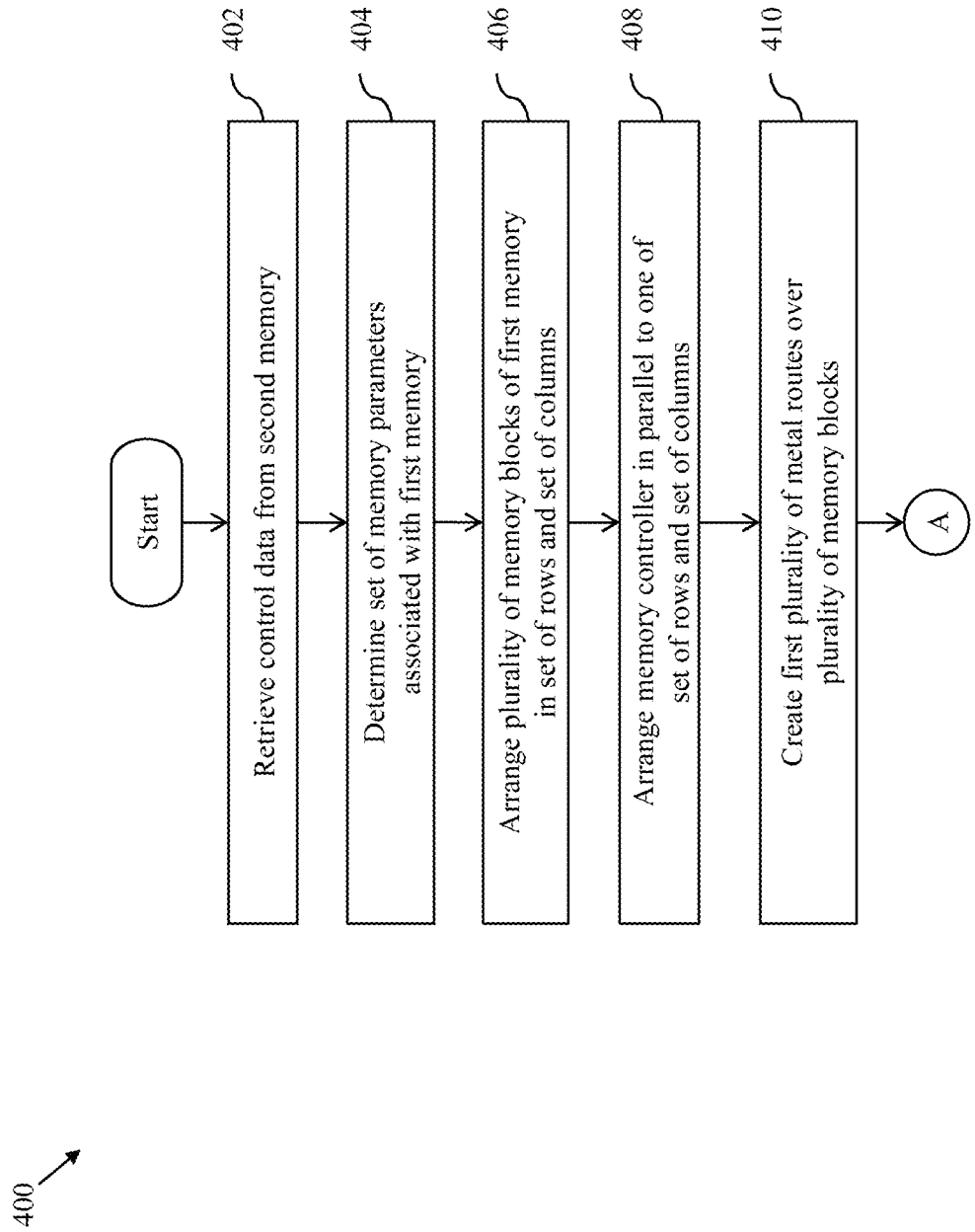
FIGS. 4A and 4B, collectively, represent a flow chart that illustrates a method for facilitating signal routing on the IC layout by using the EDA tool in accordance with an embodiment of the present disclosure.
Figure 4B:
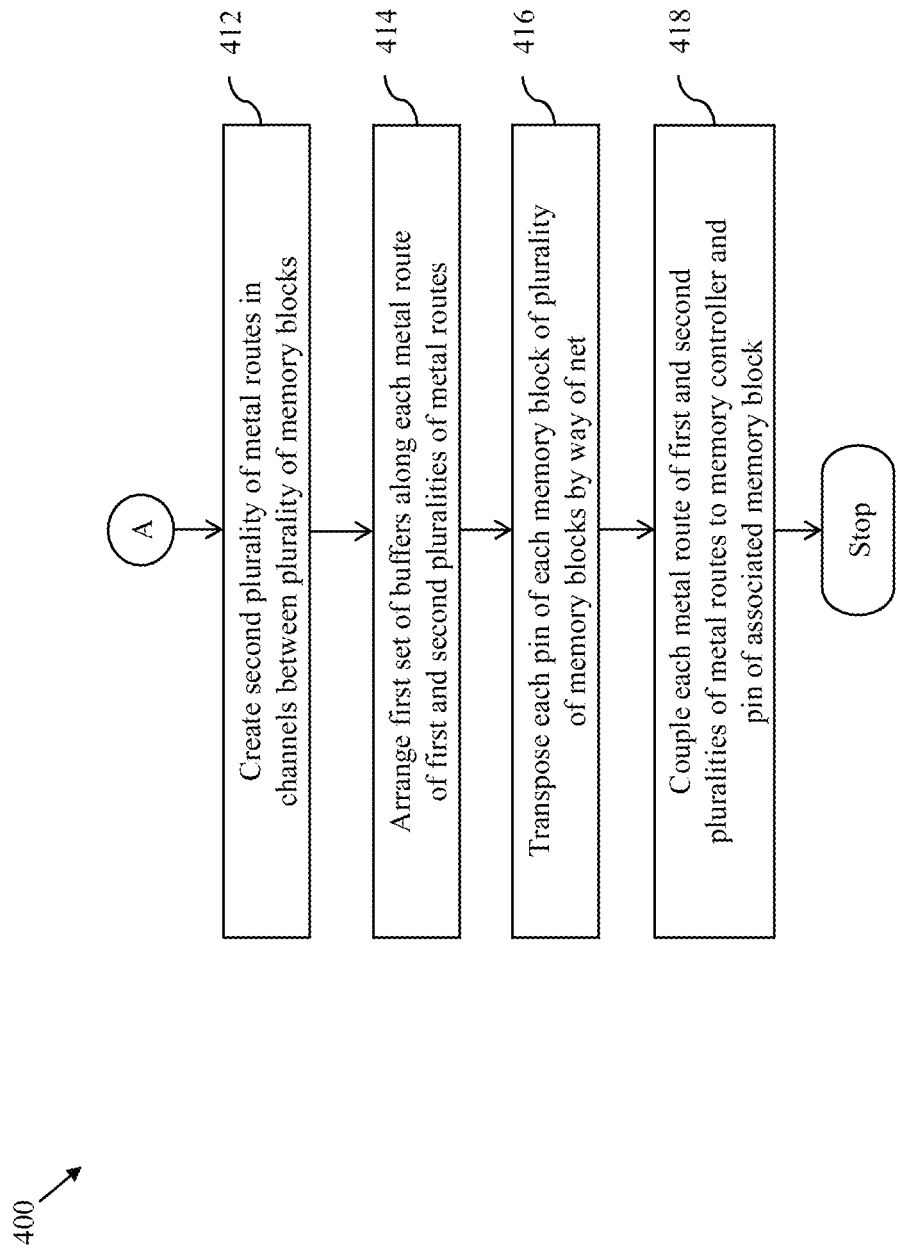

FIGS. 4A and 4B, collectively, represent a flow chart 400 that illustrates a method for facilitating the signal routing on the IC layout 100 by using the EDA tool 300 in accordance with an embodiment of the present disclosure. Referring now to FIG. 4A, at step 402, the processor 304 can retrieve the control data CD from the second memory 302. At step 404, the processor 304 can determine the set of memory parameters associated with the first memory 102. The processor 304 determines the set of memory parameters based on the control data CD. At step 406, the processor 304 can arrange the plurality of memory blocks (i.e., the first through sixth memory blocks MB1-MB6) of the first memory 102 in the set of rows W1-W3 and the set of columns C1 and C2. The processor 304 arranges the plurality of memory blocks based on the set of memory parameters. At step 408, the processor 304 can arrange the memory controller 104 in parallel to one of the set of rows W1-W3 and the set of columns C1 and C2. For the sake of ongoing discussion, it is assumed that the processor 304 arranges the memory controller 104 in parallel to the set of rows W1-W3.

At step 410, the processor 304 can create the first plurality of metal routes R1-R18. The first plurality of metal routes R1-R18 can be created such that each memory block of the plurality of memory blocks is coupled with the memory controller 104 by way of various metal routes that are created over the first set of memory blocks of the plurality of memory blocks. As the processor 304 arranges the memory controller 104 in parallel to the set of rows W1-W3, the first plurality of metal routes R1-R18 can be created over the set of columns C1 and C2. For example, in the IC layout 100 of FIG. 1, as the processor 304 arranges the memory controller 104 in parallel to the set of rows W1-W3, the processor 304 creates the first through third metal routes R1-R3 over the second and third memory blocks MB2 and MB3 to couple the first memory block MB1 with the memory controller 104.

Referring now to FIG. 4B, at step 412, the processor 304 can create the second plurality of metal routes R19 and R20 in various channels between the plurality of memory blocks. The second plurality of metal routes R19 and R20 are created for further facilitating the signal routing between the first memory 102 and the memory controller 104. At step 414, the processor 304 can arrange the first set of buffers along each metal route of the first plurality of metal routes R1-R18 and the second plurality of metal routes R19 and R20. At step 416, the processor 304 can transpose each pin (e.g., the first through third pins P1-P3) of each memory block of the plurality of memory blocks by way of a net (e.g., the first through third nets N1-N3). At step 418, the processor 304 can couple each metal route of the first plurality of metal routes R1-R18 and the second plurality of metal routes R19 and R20 to the memory controller 104 and a pin of the associated memory block. For example, the processor 304 can couple the first metal route R1 to the memory controller 104 and the third pin P3 of the first memory block MB1. Each memory block of the plurality of memory blocks can be thus coupled with the memory controller 104.

When the processor 304 arranges the memory controller 104 in parallel to the set of columns C1 and C2 (as illustrated in the IC layout 100 of FIG. 2), the signal routing between the first memory 102 and the memory controller 104 can be enabled in a similar manner as described above sans the step 414 (i.e., sans the transposition of the plurality of pins of each memory block of the plurality of memory blocks). In such a scenario, the metal routes (i.e., the third plurality of metal routes R21-R38) can be created over the set of rows W1-W3. For example, in the IC layout 100 of FIG. 2, when the processor 304 arranges the memory controller 104 in parallel to the set of columns C1 and C2, the processor 304 creates the twenty-first through twenty-third metal routes R21-R23 over the fourth memory block MB4 to couple the first memory block MB1 with the memory controller 104.

Thus, the signal routing is enabled on the IC layout 100 by creating various metal routes over various memory blocks of the first memory 102. As the metal routes (e.g., the first and third pluralities of metal routes R1-R18 and R21-R38) are created over the first memory 102 for facilitating the signal routing between the first memory 102 and the memory controller 104, an area occupied by each channel on the IC layout 100 is significantly less than that on a conventional IC layout that creates all metal routes in various channels between memory blocks of a memory. Consequently, a size of the first memory 102 is significantly less than that of the memory of the conventional IC layout, and in turn, a size of the overall IC layout 100 of the present disclosure is significantly less than that of the conventional IC layout. The decreased size of the IC layout 100 results in a low manufacturing cost of the IC of the present disclosure than that of an IC manufactured using the conventional IC layout.

While various embodiments of the present disclosure have been illustrated and described, it will be clear that the present disclosure is not limited to these embodiments only. Numerous modifications, changes, variations, substitutions, and equivalents will be apparent to those skilled in the art, without departing from the spirit and scope of the present disclosure, as described in the claims. Further, unless stated otherwise, terms such as "first" and "second" are used to arbitrarily distinguish between the elements such terms describe. Thus, these terms are not necessarily intended to indicate temporal or other prioritization of such elements.

The invention claimed is:

1. An integrated circuit (IC) layout, comprising:
a plurality of memory blocks arranged in a set of rows and a set of columns;
a memory controller arranged in parallel to the set of rows and not the set of columns or the set of columns and not the set of rows; and
a first plurality of metal routes that are created over the plurality of memory blocks and enable signal routing between the plurality of memory blocks and the memory controller, wherein the first plurality of metal routes are created such that each memory block of the plurality of memory blocks is coupled with the memory controller by way of a first set of metal routes of the first plurality of metal routes, wherein any other metal route arranged over the plurality of memory blocks which enable signaling between the plurality of memory blocks and the memory controller is parallel to the first plurality of metal routes, and wherein the first plurality of metal routes are parallel to the set of columns when the memory controller is arranged in parallel to the set of rows and the first plurality of metal routes are parallel to the set of rows when the memory controller is arranged in parallel to the set of columns.

2. The IC layout of claim 1, further comprising a set of buffers arranged along each metal route of the first plurality of metal routes, wherein a buffer of the set of buffers is arranged in a channel between first and second memory blocks of the plurality of memory blocks, and wherein the first and second memory blocks are adjacent to each other.

3. The IC layout of claim 2, wherein when the memory controller is arranged in parallel to the set of rows, the first and second memory blocks are included in a column of the set of columns, and wherein when the memory controller is arranged in parallel to the set of columns, the first and second memory blocks are included in a row of the set of rows.

4. The IC layout of claim 2, wherein the plurality of memory blocks constitute a memory, wherein the plurality of memory blocks are arranged in the set of rows and the set of columns based on a set of memory parameters associated with the memory, and wherein the set of memory parameters comprises a size of each memory block of the plurality of memory blocks, a number of memory blocks to be arranged in each row of the set of rows, and a number of memory blocks to be arranged in each column of the set of columns.

5. The IC layout of claim 4, wherein the set of memory parameters is determined based on control data, and wherein the control data comprises a number of available metal layers in an IC, a number of metal layers utilized within the plurality of memory blocks, a delay value associated with each metal route of the first plurality of metal routes, a drive value of each buffer of the set of buffers, and an access time associated with each memory block of the plurality of memory blocks.

6. The IC layout of claim 5, wherein the first plurality of metal routes are created by way of a set of metal layers associated with the IC, and wherein a number of metal layers included in the set of metal layers is determined based on the number of available metal layers in the IC and the number of metal layers utilized within the plurality of memory blocks.

7. The IC layout of claim 6, wherein the first plurality of metal routes are created based on a pitch of each metal layer of the set of metal layers and one of a width and a height of a memory block of the plurality of memory blocks.

8. The IC layout of claim 1, wherein the first plurality of metal routes are created by way of a set of metal layers associated with an IC, wherein the first set of metal routes is created over a set of memory blocks of the plurality of memory blocks, and wherein the set of memory blocks is included in one of a row of the set of rows and a column of the set of columns.

9. The IC layout of claim 8, wherein each metal route of the first plurality of metal routes is coupled with the memory controller and a pin of an associated memory block of the plurality of memory blocks, wherein for each metal route of the first plurality of metal routes, the pin of the associated memory block is transposed by way of a net for coupling the corresponding metal route with the pin, and wherein the pin is transposed when the pin is parallel to the set of rows and the set of memory blocks is included in the column of the set of columns.

10. The IC layout of claim 8, wherein when the memory controller is arranged in parallel to the set of rows, the set of memory blocks is included in the column of the set of columns, and each metal layer of the set of metal layers corresponds to a vertical metal layer, and wherein when the memory controller is arranged in parallel to the set of columns, the set of memory blocks is included in the row of the set of rows, and each metal layer of the set of metal layers corresponds to a horizontal metal layer.

11. The IC layout of claim 1, wherein a second plurality of metal routes are created in a plurality of channels associated with the plurality of memory blocks to further enable the signal routing between the plurality of memory blocks and the memory controller, wherein the second plurality of metal routes are created such that each memory block of the plurality of memory blocks is further coupled with the memory controller by way of a second set of metal routes of the second plurality of metal routes, and wherein the first and second pluralities of metal routes are created by way of a set of metal layers associated with an IC.

12. An integrated circuit (IC) layout, comprising:
a plurality of memory blocks arranged in a set of rows and a set of columns;
a memory controller arranged in parallel to the set of rows and not the set of columns or the set of columns and not the set of rows; and
a first plurality of metal routes that are created over the plurality of memory blocks and enable signal routing between the plurality of memory blocks and the memory controller, wherein the first plurality of metal routes are created such that each memory block of the plurality of memory blocks is coupled with the memory controller by way of a first set of metal routes of the first plurality of metal routes, wherein any other metal route arranged over the plurality of memory blocks which enable signaling between the plurality of memory blocks and the memory controller is parallel to the first plurality of metal routes, and wherein the first plurality of metal routes are parallel to the set of columns when the memory controller is arranged in parallel to the set of rows and the first plurality of metal routes are parallel to the set of rows when the memory controller is arranged in parallel to the set of columns, wherein the first plurality of metal routes are created by way of a set of metal layers associated with an IC, wherein each metal layer of the set of metal layers corresponds to one of a horizontal metal layer and a vertical metal layer, and wherein a number of metal layers included in the set of metal layers is determined based on a number of available metal layers in the IC and a number of metal layers utilized within the plurality of memory blocks.

13. The IC layout of claim 12, further comprising a set of buffers arranged along each metal route of the first plurality of metal routes, wherein a buffer of the set of buffers is arranged in a channel between first and second memory blocks of the plurality of memory blocks, wherein the first and second memory blocks are adjacent to each other, and wherein when the memory controller is arranged in parallel to the set of rows, the first and second memory blocks are included in a column of the set of columns, and when the memory controller is arranged in parallel to the set of columns, the first and second memory blocks are included in a row of the set of rows.

14. The IC layout of claim 13, wherein the plurality of memory blocks constitute a memory, wherein the plurality of memory blocks are arranged in the set of rows and the set of columns based on a set of memory parameters associated with the memory, wherein the set of memory parameters comprises a size of each memory block of the plurality of memory blocks, a number of memory blocks to be arranged in each row of the set of rows, and a number of memory blocks to be arranged in each column of the set of columns, and wherein the set of memory parameters is determined based on control data that comprises the number of available metal layers in the IC, the number of metal layers utilized within the plurality of memory blocks, a delay value associated with each metal route of the first plurality of metal routes, a drive value of each buffer of the set of buffers, and an access time associated with each memory block of the plurality of memory blocks.

15. The IC layout of claim 12, wherein the first plurality of metal routes are created based on a pitch of each metal layer of the set of metal layers and one of a width and a height of a memory block of the plurality of memory blocks.

16. The IC layout of claim 12, wherein the first set of metal routes is created over a set of memory blocks of the plurality of memory blocks, and wherein the set of memory blocks is included in one of a row of the set of rows and a column of the set of columns.

17. The IC layout of claim 16, wherein each metal route of the first plurality of metal routes is coupled with the memory controller and a pin of an associated memory block of the plurality of memory blocks, wherein for each metal route of the first plurality of metal routes, the pin of the associated memory block is transposed by way of a net for coupling the corresponding metal route with the pin, and wherein the pin is transposed when the pin is parallel to the set of rows and the set of memory blocks is included in the column of the set of columns.

18. A method for enabling signal routing on an integrated circuit (IC) layout using an electronic design automation tool, the method comprising:
arranging a plurality of memory blocks of a memory in a set of rows and a set of columns;
arranging a memory controller in parallel to the set of rows and not the set of columns or the set of columns and not the set of rows; and
creating a first plurality of metal routes over the plurality of memory blocks such that each memory block of the plurality of memory blocks is coupled with the memory controller by way of a first set of metal routes of the first plurality of metal routes, wherein any other metal route arranged over the plurality of memory blocks which enable signaling between the plurality of memory blocks and the memory controller is parallel to the first plurality of metal routes, and wherein the first plurality of metal routes are parallel to the set of columns when the memory controller is arranged in parallel to the set of rows and the first plurality of metal routes are parallel to the set of rows when the memory controller is arranged in parallel to the set of columns, wherein the first plurality of metal routes enable the signal routing between the plurality of memory blocks and the memory controller.

19. The method of claim 18, further comprising arranging a set of buffers along each metal route of the first plurality of metal routes, wherein a buffer of the set of buffers is arranged in a channel between first and second memory blocks of the plurality of memory blocks, and wherein the first and second memory blocks are adjacent to each other.

20. The method of claim 19, further comprising determining a set of memory parameters associated with the memory based on control data, wherein the set of memory parameters comprises a size of each memory block of the plurality of memory blocks, a number of memory blocks to be arranged in each row of the set of rows, and a number of memory blocks to be arranged in each column of the set of columns, wherein the control data comprises a number of available metal layers in an IC, a number of metal layers utilized within the plurality of memory blocks, a delay value associated with each metal route of the first plurality of metal routes, a drive value of each buffer of the set of buffers, and an access time associated with each memory block of the plurality of memory blocks, and wherein the plurality of memory blocks are arranged in the set of rows and the set of columns based on the set of memory parameters.

* * * * *